United States Patent
Croke, III

(10) Patent No.: US 6,316,795 B1
(45) Date of Patent: Nov. 13, 2001

(54) SILICON-CARBON EMITTER FOR SILICON-GERMANIUM HETEROJUNCTION BIPOLAR TRANSISTORS

(75) Inventor: Edward T. Croke, III, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/541,737

(22) Filed: Apr. 3, 2000

(51) Int. Cl.$^7$ ................................................. H01L 31/072
(52) U.S. Cl. ........................ 257/197; 257/77; 257/198; 438/312; 438/694
(58) Field of Search .................................. 257/197, 198, 257/77; 438/312, 694

(56) References Cited

U.S. PATENT DOCUMENTS

| | | |
|---|---|---|
| 5,028,973 | 7/1991 | Bajor . |
| 5,387,807 * | 2/1995 | Bayraktaroglu ........................ 257/197 |
| 5,395,774 | 3/1995 | Bajor . |
| 5,557,118 * | 9/1996 | Hashimoto ............................ 257/197 |
| 5,708,281 | 1/1998 | Morishita . |
| 5,859,447 * | 1/1999 | Yang et al. ........................... 257/197 |

FOREIGN PATENT DOCUMENTS

05090278-A * 4/1993 (JP) .
09205101-A * 8/1997 (JP) .

OTHER PUBLICATIONS

Sturm et al., JEDM, Tech. Dig. p. 249, 1996.
J.W. Erickson, J. Sheng, Y. Gao, H. Pham, and I.L. Singer, "Carbon Overcoat Composition and Structure Analysis by Secondary Ion Mass Spectrometry", J. Vac. Sci. Technol. A 16(3) May/Jun. 1998.
H.J. Osten, B. Heinemann, D. Knoll, G. Lippert, and H. Rucker, "Effects of carbon on boron diffuxion in SiGe: Principles and impact on bipolar devices", J. Vac. Sci. Tech. B, vol. 16, No. 3, p. 1750 (1998).

* cited by examiner

Primary Examiner—Nathan Flynn
Assistant Examiner—Remmon R. Fordé
(74) Attorney, Agent, or Firm—Tope-McKay & Associates

(57) ABSTRACT

The invention provides an effective means and apparatus for allowing higher operational frequencies in heterojunction bipolar transistors by trapping silicon interstitial atoms and thereby preventing transient enhanced diffusion of boron the transistor. The invention provides for selective placement of a carbon layer in the emitter region of a heterojunction bipolar transistor. Such a layer is capable of effectively eliminating transient enhanced boron diffusion without the undesirable performance consequences.

8 Claims, 5 Drawing Sheets

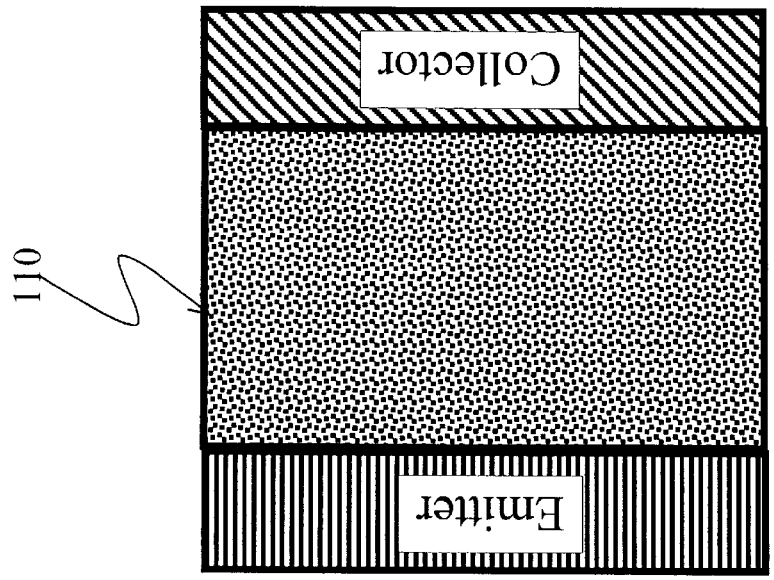
FIG 1b
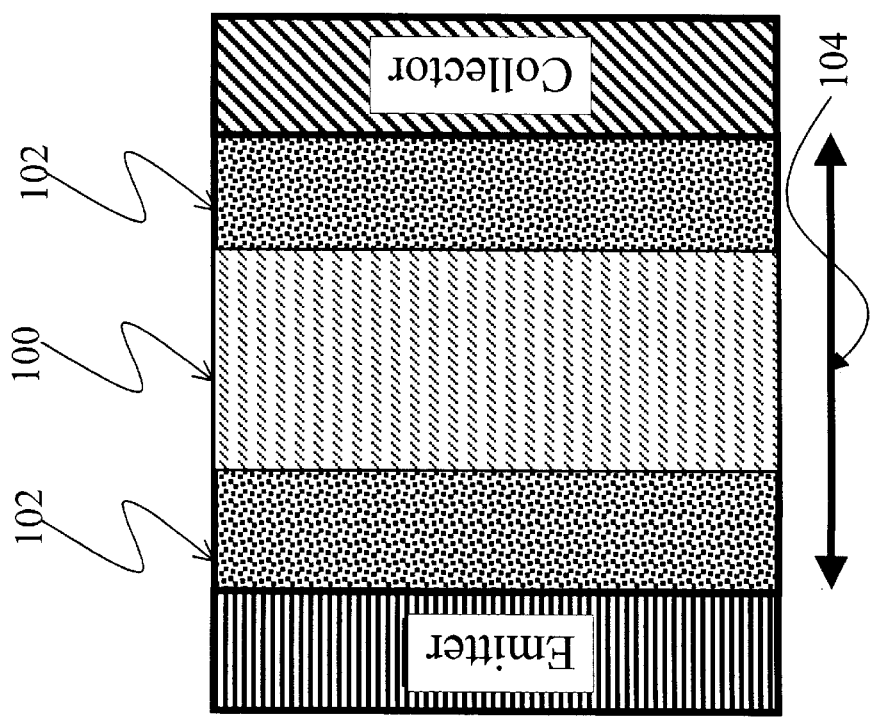
FIG 1a
FIG. 1

SILICON-CARBON EMITTER FOR SILICON-GERMANIUM HETEROJUNCTION BIPOLAR TRANSISTORS

TECHNICAL FIELD

This invention relates to a method and apparatus for increasing the gain and speed of Silicon-Germanium heterojunction bipolar transistors. More specifically, the invention provides a means for using a carbon-doped silicon emitter to trap silicon interstitial atoms, to reduce transient enhanced diffusion of boron.

BACKGROUND OF THE INVENTION

Heterojunction bipolar transistor integrated circuits are used in a wide variety of applications including satellite telecommunication systems, high-speed analog/digital converters, wireless communications circuits, radar systems, and Microwave Monolithic Integrated Circuits (MMICs). Silicon-Germanium heterojunction bipolar transistors exhibit significantly enhanced performance relative to silicon homojunction transistors. Silicon-Germanium heterojunction bipolar transistors offer a lower barrier for electron injection into the base as compared to homojunction devices.

A problem common to npn Silicon-Germanium devices is the out-diffusion of boron from the Silicon-Germanium component. This out-diffusion can result from a number of factors including transient enhanced diffusion resulting from an annealing step. The boron out-diffusion into the silicon region is undesirable, in part, because it results in the formation of a parasitic conduction band barrier thereby reducing the transistor's gain and speed.

In an attempt to overcome the problems associated with boron out-diffusion, undoped SiGe spacer layers have been deposited on either side of the boron-doped SiGe base layer. This previous technology is shown schematically in FIG. 1a. The boron-rich region 100 is flanked by two SiGe spacer layers 102, the spacer layers 102 are included in anticipation of boron diffusion. Such an approach results in a base layer thickness 104 that may be twice as thick as the base layer provided for in the present invention.

An alternate approach, according to the literature, for limiting boron diffusion has been to dope the boron doped SiGe base layer with carbon 110. This approach, while generally effective in preventing boron out-diffusion, has serious limitations. First the carbon concentration necessary to mitigate the effects of boron diffusion may necessarily exceed $1\times10^{19}$ cm$^{-3}$ with as much as 50% of the carbon located interstitially. This level of interstitial carbon can reduce the mobility, and hence the speed, of SiGe HBTs by as much as a factor of 10. This reduction results, in part, from the fact that SiGe has a higher hole mobility than SiGe doped with carbon, which is due to the lack of carbon-related complexes associated with interstitial or otherwise non-substitutional carbon. Additionally, traps associated with non-substitutional carbon can affect the position of the Fermi level in the base, which also adversely affect device performance. None of the existing methods allows for the concurrent enhancement of base mobilities and for substantial elimination of boron out-diffusion.

SUMMARY OF THE INVENTION

The embodiments described herein improve the performance of SiGe HBT devices by allowing for the concurrent enhancement of base mobilities and substantial elimination of boron out-diffusion.

One embodiment of the invention relates to a heterojunction bipolar transistor having a carbon-containing layer in the emitter. Wherein the transistor comprises a first semiconductor layer of a first conductivity type, grown on a semiconductor substrate, a second semiconductor layer of a second conductivity type grown on the first semiconductor layer, and a third semiconductor layer of the first conductivity type on the second semiconductor layer wherein the third semiconductor layer is comprised of three substantially planer regions. Further, the first and third planer regions are optionally of substantially of the same composition; and the second planer region contains doped silicon and carbon.

In another embodiment of the invention a heterojunction bipolar transistor has a first semi-conducting layer that is comprised of silicon doped with approximately $5\times10^{16}$ atoms of antimony per cm$^{-3}$, and the second semi-conducting layer is comprised of SiGe$_{0.4}$ and doped with approximately $1\times10^{20}$ atoms of boron per cm$^{-3}$. The third semi-conducting layer is comprised of three substantially regions, and the first planer region of the third semi-conducting layer is doped with approximately $2\times10^{18}$ atoms of antimony per cm$^{-3}$ and the second planer region is comprised of Si$_{0.999}$C$_{0.001}$ doped with approximately $2\times10^{18}$ atoms of antimony per cm$^{-3}$ and the third planer region of the third semi-conducting layer is doped approximately $2\times10^{18}$ atoms of antimony per cm$^{-3}$.

BRIEF DESCRIPTION OF THE DRAWINGS

The objects, features, and advantages of the present invention will be apparent from the following detailed description of the preferred embodiment of the invention with references to the following drawings.

FIG. 1a shows an HBT according to the literature, this device limits boron out-diffusion by placing spacer layers on either side of the boron doped base layer;

FIG. 1b shows another HBT according to the literature, in this case born out diffusion is limited by doping the base layer with carbon;

DESCRIPTION OF THE PREFERRED EMBODIMENTS

Figure 2:
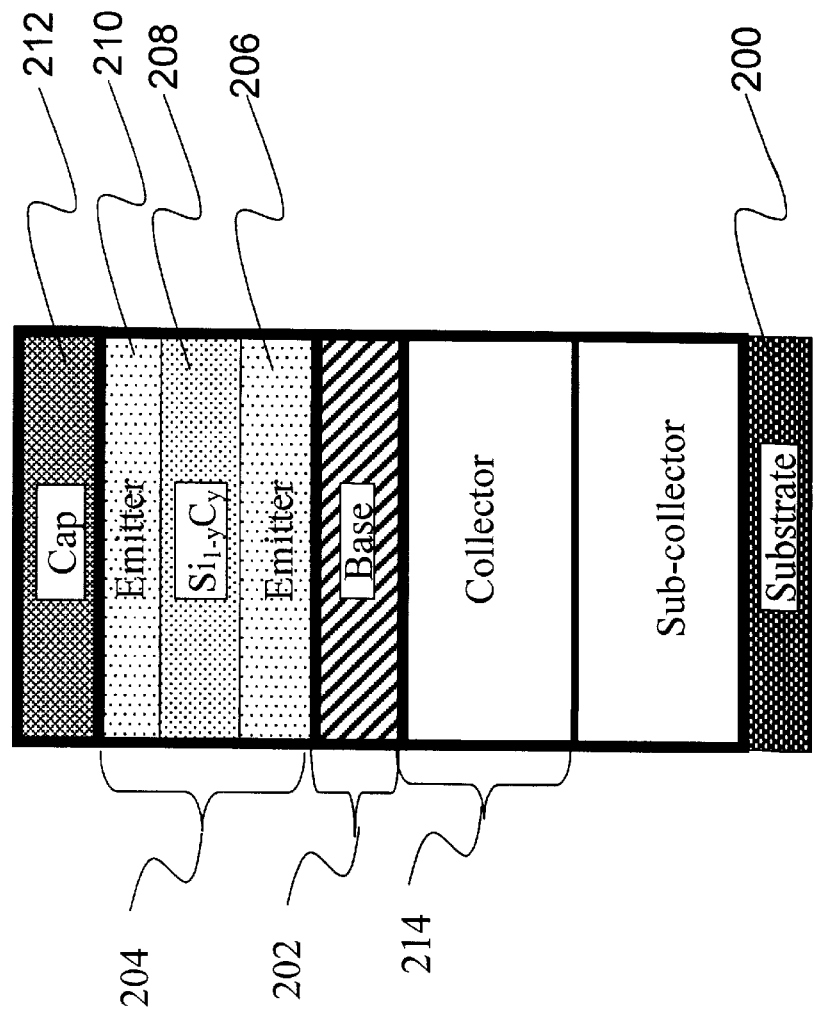
FIG. 2 Shows an npn SiGe-HBT layer structure, the structure includes the carbon containing region in the emitter layer.

The present invention provides a method and an apparatus useful for reducing transient enhanced diffusion of boron, thereby enhancing the performance characteristics of Silicon-Germanium heterojunction bipolar transistors, and may be tailored to a variety of other applications. The following description, taken in conjunction with the referenced drawings, is presented to enable one of ordinary skill in the art to make and use the invention and to incorporate it in the context of particular applications. Various modifications, as well as a variety of uses in different applications, will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein. Furthermore it should be noted that unless explicitly stated otherwise, the figures included herein are illustrated diagrammatically and without any specific scale, with the express clarification that as this is specifically an example, no restrictive or exclusive character should be assigned to it, its purport being merely illustrative of the fundamental concept on which it is based.

The invention provides an effective means for trapping Si interstitial atoms using a carbon-doped silicon emitter to reduce transient enhanced diffusion of boron and overcomes many of the performance limitations inherent in prior boron diffusion inhibiting schemes. One of the novel aspects of the present invention includes a carbon-doped region in the Si emitter. This carbon-doped region is capable of effectively trapping Si interstitial atoms and thereby preventing transient enhanced diffusion (TED) of boron. The current invention calls for the selective placement of a carbon layer in the emitter region of an HBT. Such a layer is capable of effectively eliminating transient enhanced boron diffusion without the undesirable performance consequences encountered in previous systems.

When boron diffusion is not effectively controlled, the region contaminated with diffused boron acts as a barrier to electron transport. In such cases there is a resulting increase in the barrier for electron transport (in an npn implementation) and will have the effect of significantly decreasing the gain and speed of the HBT device. The current invention provides for the deposition of a carbon-doped layer in the heterojunction bipolar transistor emitter. Said carbon-doped layer effectively traps Si interstitial atoms that would normally diffuse through the base and result in reduced device performance. Silicon interstitial atoms are typically created during post-epitaxial growth processing. Such processing usually includes ion implantation, which is used to reduce emitter or base contact resistance. The carbon-doped emitter approach of the present invention minimizes the base thickness, by eliminating the need for the spacer layers. The thinner base layer appreciably reduces the time necessary for minority carriers (in an npn implementation) to traverse from emitter to collector. The time for the carriers to traverse from the emitter to the collector is referred to as "base transit time." Often, the base transit time is the limiting factor in determining $f_T$, or the unity-gain cutoff frequency of the device; therefore reducing the base transit time generally results in higher operational frequencies. Furthermore the maximum operating frequency, $f_{max}$, is generally limited by the product of the base resistance and junction capacitances. Junction capacitances include capacitances arising from junctions within the heterojunction bipolar transistor such as the base-collector junction. It follows that a reduction in junction capacitance or base resistance results in an increased $f_{max}$.

By moving the carbon doping into the emitter, as per the current invention, the speed of SiGe is appreciably increased, and boron out-diffusion is prevented during post-epitaxial growth processing. A schematic diagram of an HBT layer structure according to one embodiment of the present invention is provided in FIG. 2. The compositional layers can all be grown epitaxially on a Si substrate 200 in a single growth run. The substrate 200 in one preferred embodiment is comprised of silicon. The silicon substrate 200 optionally will have a resistivity greater than 5 kΩ-cm. In one embodiment the base layer 202 could be on the order of 10 nm $Si_{0.5}Ge_{0.5}$ thick, and doped with boron to $1 \times 10^{20}$ $cm^{-3}$ or higher. Deposition of the base 202 is followed by deposition of the emitter 204, which is comprised of three layers. The first layer 206 in the emitter is n-type doped silicon. This first layer 206 is closest to the base layer 202 and may optionally may be grown to a nominal thickness of 90 nm, and may be antimony-doped silicon, Si:Ge $2 \times 10^{18}$ $cm^{-3}$. The next layer within the emitter is the n-$Si_{1-y}C_y$ layer 208, which serves as a trap for diffusing Si interstitial atoms, originating from the emitter cap region 212. The n-$Si_{1-y}C_y$ layer 208 in one embodiment is approximately 10 nm thick and is comprised of n-$SiC_{0.001}$:Sb $2 \times 10^{18} cm^{-3}$. The placement of the n-$Si_{1-y}C_y$ layer 208 should be completely outside the base-emitter depletion layer. The diffusing interstitial Si atoms may result partially from the emitter contact implant, and partially from the extrinsic base region due to the base contact implant. In the latter case, a large emitter stripe width would be required for effective reduction of boron out-diffusion associated with TED. Alternatively closer proximity of the n-$Si_{1-y}C_y$ layer 208 to the base 202 could effectively reduce the boron out-diffusion. Finally, the top layer of the emitter 210 is also n-doped silicon. In one embodiment the top emitter layer may be approximately 200 nm thick and composed of antimony-doped silicon, the dopant concentration should be of the same order as the first emitter layer 206. Finally there is an emitter cap region 212, which is heavily doped, nominally $5 \times 10^{19}$ $cm^{-3}$, n-Si, to serve as a contact layer for the emitter 204. The collector 214 in one preferred embodiment could be on the order of 300 nm, and comprised of lightly doped n-type silicon, wherein the doping is on the order of about $5 \times 10^{16}$. It should be understood that the values given are provided only for illustration are not intended to be limiting. For instance the carbon concentration may be significantly increased without adversely impacting the heterojunction bipolar transistor's performance characteristics. The presence of the carbon-doped layer 208 in the emitter 204 allows greater flexibility in the design of the base 202 because the structure no longer needs undoped SiGe spacer layers 100 to contain the boron. The base thickness can therefore be decreased and the Ge concentration increased without creating defects generally associated with strain relaxation. Since the base is now thinner, the base transit time is reduced and $f_T$ is increased. Additionally the performance limitations resulting from carbon doping of the base layer are not present in the current invention.

Figure 3A:
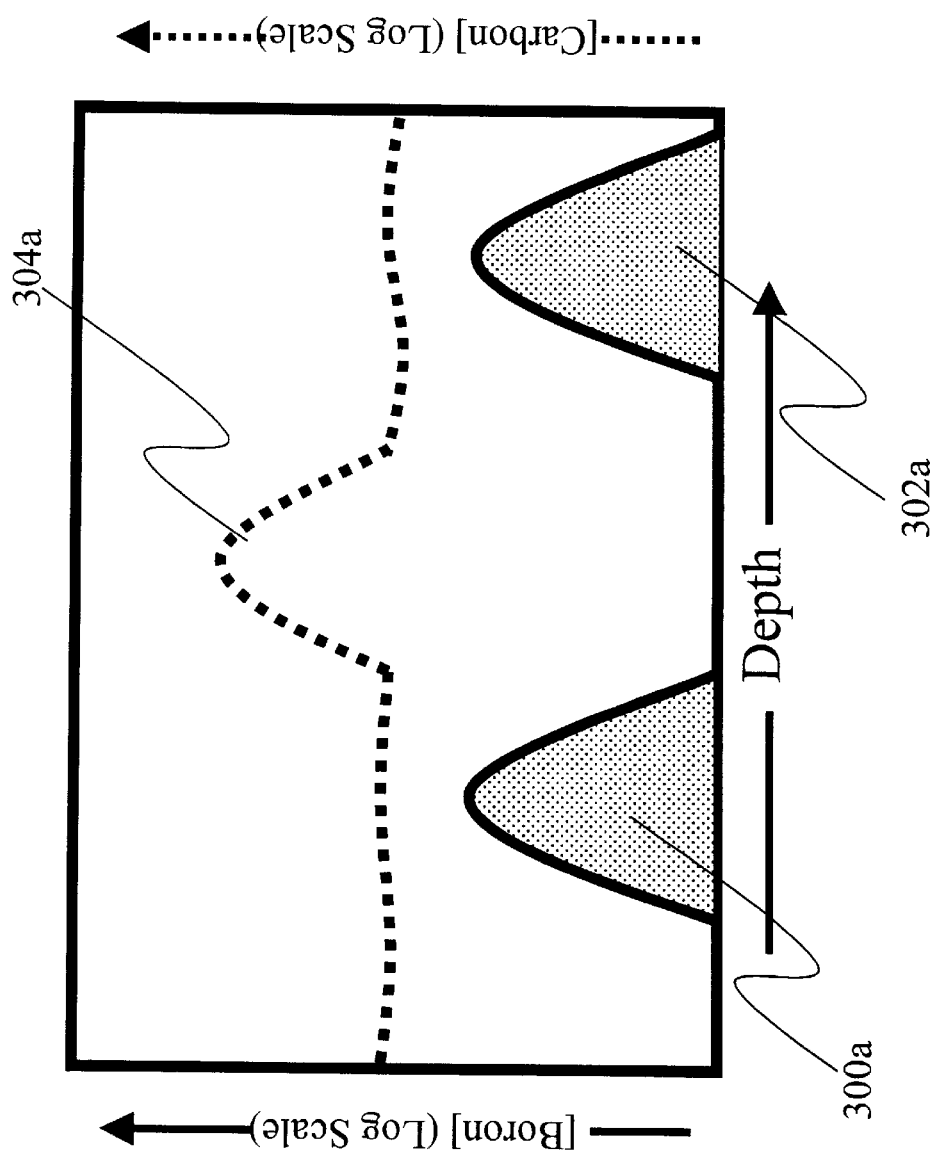
FIG. 3a depicts (secondary ion mass spectroscopy) SIMS profiles obtained from asgrown.
Figure 3B:
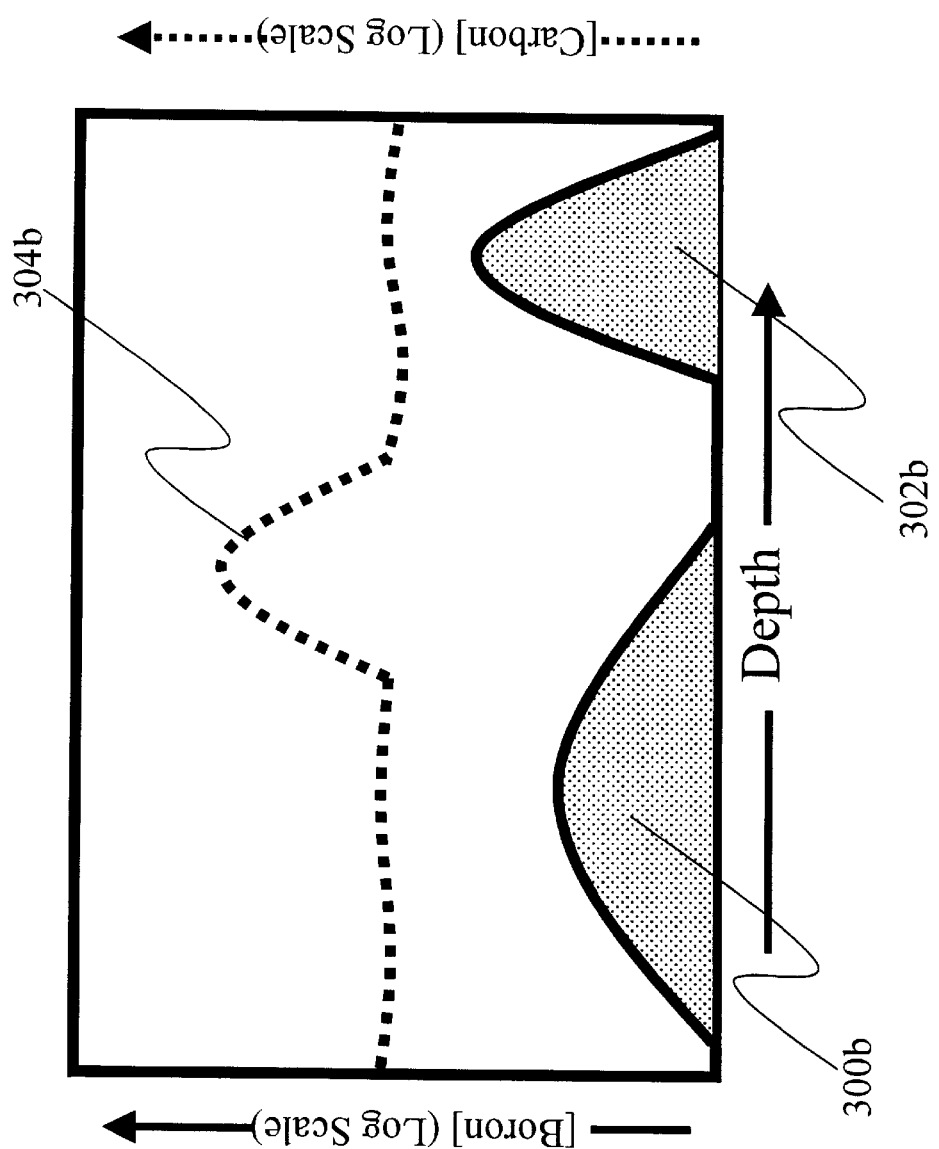
FIG. 3b Depicts SIMS profiles obtained from implant-damaged test samples, the FIG that the carbon-doped layer traps diffusing silicon interstitials leaving the deeper Si:B layer relatively unaffected.

The effect of using an n-$Si_{1-y}C_y$ layer in the emitter is graphically depicted in FIG. 3a and FIG. 3b. In this embodiment a thin layer comprised of $Si_{1-y}C_y$ is placed within the emitter to minimize boron diffusion in lower layers. Specifically FIG. 3a and FIG. 3b show before and after secondary ion mass spectroscopy (SIMS) profiles of a test structure consisting of several layers grown by molecular beam epitaxy. There are two Si:B layers in the initial structure, the first 300a is on the left, and the second 302a is on the right. The Si:B layers are separated from each other, and a $Si_{0.999}C_{0.001}$ layer, 304a by undoped Si. There is also a Si cap that is used to separate the top Si:B layer 300a from the surface. The SIMS profile obtained from an as-grown sample, before any implant damaging processing is shown in FIG. 3a. The SIMS profile obtained from the sample after it was implant-damaged is shown in FIG. 3b. The profiles shown in FIG. 3a are those of an as-grown sample, annealed at 750° C. for 4.25 min. Note the nearly identical half-widths for both the first 300a boron doped layer and the second boron-doped layer 302a.

After implanting the as-grown sample with $1 \times 10^{14}$ $cm^{-2}$ Si at 40 keV and annealing, the profiles in FIG. 3b were obtained. The Si:B layer nearest the sample surface 300b has diffused considerably, while the width of the Si:B layer deposited below the $Si_{0.999}C_{0.001}$ layer 302b is virtually unchanged. The presence of the $Si_{0.999}C_{0.001}$ layer 304b has prevented boron diffusion in the Si:B layer below the $Si_{0.999}C_{0.001}$ layer. Furthermore it has been left essentially unaffected by the processing steps. Diffusing Si interstitial atoms, generated during the implantation process, are trapped in the intervening $S_{0.999}C_{0.001}$ layer, 304 preventing boron out-diffusion in the layer below 302b.

Figure 4:
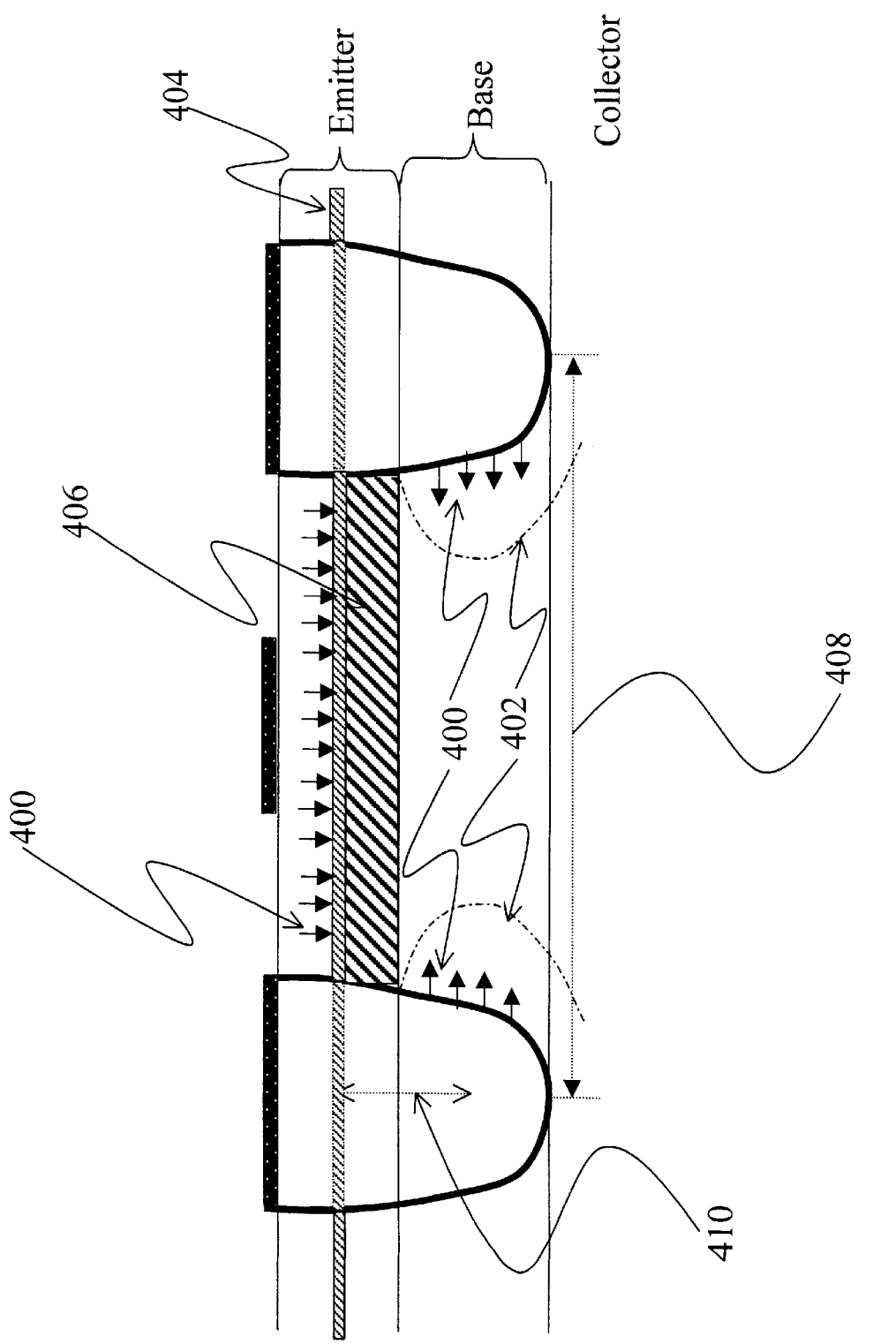
FIG. 4 shows one embodiment of the present invention, specifically noted is that the carbon-containing layer is not impinging on the base-emitter depletion layer.

An implementation of the present invention is shown in FIG. 4. The small arrows depict interstitial Si atom 400 diffusion paths. The diffusion gradient 402 in the base layer is the result of Si interstitial diffusion. It should be noted that the $Si_{1-y}C_y$ layer 404 effectively traps the Si interstitial atoms 402 and prevents them from diffusing into the base layer. The placement of the $Si_{1-y}C_y$ layer 404 may optionally be placed either within or outside the depletion region. The layer may optionally overlap the base-emitter depletion layer 406. This invention is particularly appropriate in applications where the device width 408 is greater than the device depth 410. In this context, device depth refers to the distance from halfway through base to the $Si_{1-y}C_y$ layer 404 within the emitter.

What is claimed is:

1. A heterojunction bipolar transistor having a carbon containing layer, said transistor comprising:
   i. a first semiconductor or layer of a first conductivity type on a semiconductor substrate;
   ii. a second semiconductor layer of a second conductivity type on the first semiconductor or layer; and
   iii. a third semiconductor layer of the first conductivity type on the second semiconductor layer;
   wherein the third semiconductor layer is comprised of three substantially planer layered regions; and
   wherein the first and third planer regions are substantially of the same composition and the second planer region contains doped silicon and carbon.

2. The heterojunction bipolar transistor of claim 1 wherein the first and second semi-conducting layers are doped n-type and the second semi-conducting layer is doped p-type.

3. The heterojunction bipolar transistor of claim 1, wherein:
   the first semi-conducting layer is an n-doped collector and sub-collector;
   the second semi-conducting layer is an p-doped base; and
   the third semi-conducting layer is an n-doped emitter.

4. The heterojunction bipolar transistor of claim 1 wherein the first and third semi-conducting layers are comprised of silicon doped with antimony and the second semi-conducting layer is comprised of silicon and germanium doped with boron.

5. The heterojunction bipolar transistor of claim 1 wherein the first semi-conducting layer is comprised of silicon doped with approximately $5 \times 10^{16}$ atoms of antimony per $cm^{-3}$, and the second semi-conducting layer is comprised of $SiGe_{0.4}$ and doped with approximately $1 \times 10^{20}$ atoms of boron per $cm^{-3}$.

6. The heterojunction bipolar transistor of claim 1 wherein the first semi-conducting layer is silicon doped with approximately $5 \times 10^{16}$ atoms of antimony per $cm^{-3}$, and the second semi-conducting layer is comprised of $SiGe_{0.4}$ and with approximately $1 \times 10^{20}$ atoms of boron per $cm^{-3}$ and the first planer region of the third semi-conducting layer is doped approximately $2 \times 10^{18}$ atoms of antimony per $cm^{-3}$ and the second planer region is comprised of $Si_{0.999}C_{0.001}$ doped with approximately $2 \times 10^{18}$ atoms of antimony per $cm^{-3}$ and the third planer region of the third semi-conducting layer is doped approximately $2 \times 10^{18}$ atoms of antimony per $cm^{-3}$.

7. The heterojunction bipolar transistor of claim 1;
   wherein the first semiconductor layer is a transistor collector;
   wherein the second semiconductor layer is a transistor base; and
   wherein the third semiconductor layer is a transistor emitter; and
   when the transistor is active there is a base-emitter depletion region extending into the second and third semiconductor layers and wherein the carbon containing planer region is not within the base-emitter depletion region.

8. The heterojunction bipolar transistor of claim 1;
   wherein the first semiconductor layer is a transistor collector;
   wherein the second semiconductor layer is a transistor base; and
   wherein the third semiconductor layer is a transistor emitter;
   when the transistor is active there is a base emitter depletion region extending into the second and third semiconductor layers and wherein the carbon containing planer region of the third semiconductor layer is within the base-emitter depletion region.

* * * * *